(12) United States Patent
Shirahama

(10) Patent No.: US 10,121,942 B2
(45) Date of Patent: Nov. 6, 2018

(54) PACKAGE INCLUDING RESIN MOLDED BODY HAVING BLACK RESIN PART AND LIGHT REFLECTIVE FOAM PART, AND METHOD FOR MANUFACTURING PACKAGE, LIGHT EMITTING DEVICE, AND METHOD FOR MANUFACTURING LIGHT EMITTING DEVICE

(71) Applicant: NICHIA CORPORATION, Anan-shi, Tokushima (JP)

(72) Inventor: Motokiyo Shirahama, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/785,945

(22) Filed: Oct. 17, 2017

(65) Prior Publication Data
US 2018/0151782 A1 May 31, 2018

(30) Foreign Application Priority Data
Nov. 30, 2016 (JP) ................. 2016-232649

(51) Int. Cl.
| | | |
|---|---|---|
| H01L 33/52 | (2010.01) | |
| H01L 33/58 | (2010.01) | |
| B29C 45/16 | (2006.01) | |
| H01L 21/56 | (2006.01) | |
| B29C 45/03 | (2006.01) | |
| H01L 33/50 | (2010.01) | |

(52) U.S. Cl.
CPC ............. *H01L 33/52* (2013.01); *B29C 45/03* (2013.01); *B29C 45/16* (2013.01); *H01L 21/56* (2013.01); *H01L 33/50* (2013.01); *H01L 33/58* (2013.01)

(58) Field of Classification Search
CPC ....... H01L 33/48; H01L 33/486; H01L 33/52; H01L 21/56; H01L 23/28–23/3192; H01L 33/58; H01L 33/60
See application file for complete search history.

(56) References Cited

U.S. PATENT DOCUMENTS

| | | | | |
|---|---|---|---|---|
| 8,933,548 B2* | 1/2015 | Oda | ............. | H01L 24/97 257/669 |
| 9,178,123 B2* | 11/2015 | Sakariya | ............. | H01L 25/0753 |
| 9,640,709 B2* | 5/2017 | Gubser | ............. | H01L 31/186 |
| 2013/0134468 A1* | 5/2013 | Fukushima | ............. | H01L 33/486 257/98 |
| 2015/0115793 A1* | 4/2015 | Miyashita | ............. | H05B 33/04 313/512 |
| 2015/0323157 A1* | 11/2015 | Jeong | ............. | F21V 11/16 362/237 |
| 2016/0372645 A1* | 12/2016 | Sakai | ............. | C08K 3/0033 |
| 2017/0229624 A1* | 8/2017 | Beppu | ............. | H01L 33/60 |

FOREIGN PATENT DOCUMENTS

| | | |
|---|---|---|
| JP | 2006-130714 A | 5/2006 |
| JP | 2012-182401 A | 9/2012 |
| JP | 5831013 B2 | 12/2015 |

\* cited by examiner

*Primary Examiner* — Scott B Geyer

(57) ABSTRACT

A package includes an element placement region, a pair of leads and a resin molded body. The resin molded body holds the pair of leads. The resin molded body includes a black resin part, and a light reflective foam part arranged at least on a part of a surface of the black resin part in a light irradiation region configured to be irradiated by light from a light emitting element placed in the element placement region.

6 Claims, 5 Drawing Sheets

PACKAGE INCLUDING RESIN MOLDED BODY HAVING BLACK RESIN PART AND LIGHT REFLECTIVE FOAM PART, AND METHOD FOR MANUFACTURING PACKAGE, LIGHT EMITTING DEVICE, AND METHOD FOR MANUFACTURING LIGHT EMITTING DEVICE

CROSS REFERENCE TO RELATED APPLICATIONS

This application claims priority to Japanese Patent Application No. 2016-232649, filed on Nov. 30, 2016. The entire disclosure of Japanese Patent Application No. 2016-232649 is hereby incorporated herein by reference.

TECHNICAL FIELD

The present invention relates to a package and a method for manufacturing a package, and a light emitting device and a method for manufacturing a light emitting device.

BACKGROUND ART

As a light emitting device provided with a semiconductor light emitting element (hereafter, "light emitting element"), light emitting devices using a resin package provided with leads and molded resin are known. For example, with a light emitting device for a display, to improve the contrast, a black resin package that uses black resin is known. A two-color resin package for which white resin is used for the inner surface of the recess in which the light emitting element is placed, and black resin is used around that is also known. By using a two-color resin package, it is possible to improve the contrast while reducing the absorption of light from the light emitting element. Japanese Laid-Open Patent Application Publication No. 2006-130714 discloses such a conventional light emitting device.

SUMMARY

The two-color resin package noted in Japanese Laid-Open Patent Application Publication No. 2006-130714 is costly because two types of resin are used and molding is performed twice. There are also cases when problems arise such as having a gap appear between the two types of resin.

The present disclosure includes the following configuration.

A package includes an element placement region, a pair of leads and a resin molded body. The resin molded body holds the pair of leads. The resin molded body includes a black resin part, and a light reflective foam part arranged at least on a part of a surface of the black resin part in a light irradiation region configured to be irradiated by light from a light emitting element placed in the element placement region.

From the above, it is possible to obtain a resin package and light emitting device with reduced light absorption and excellent contrast at low cost.

DETAILED DESCRIPTION OF THE EMBODIMENTS

Figure 1A:
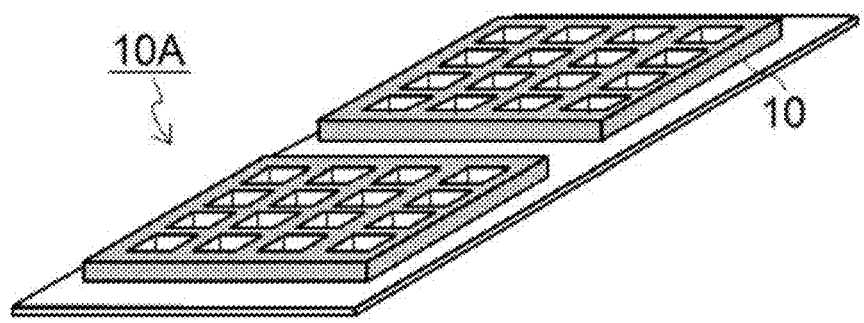
FIG. 1A is a schematic perspective view showing a package of an embodiment.

Modes for carrying out the present invention are explained hereafter while referring to the drawings. Note that the modes shown hereafter show examples of the package and the light emitting device for embodying the technical concepts of the present invention, and the present invention is not limited to the following package and the light emitting device.

Also, this specification does not specify members shown in the scope of patent claims as being the members in the embodiments. In particular, unless specifically noted, the dimensions, materials, shape, relative arrangement, etc., of the structural components noted in the embodiments are nothing more than explanatory examples, and the gist of the invention is not limited only to the scope of the disclosure. Note that the size and positional relationship, etc. of the members shown in each drawing may be exaggerated to make the explanation clearer. Also, with the explanation hereafter, the same name or code number indicates a member that is the same or of the same nature, and a detailed explanation will be omitted as appropriate.

Embodiment 1

Figure 1B:
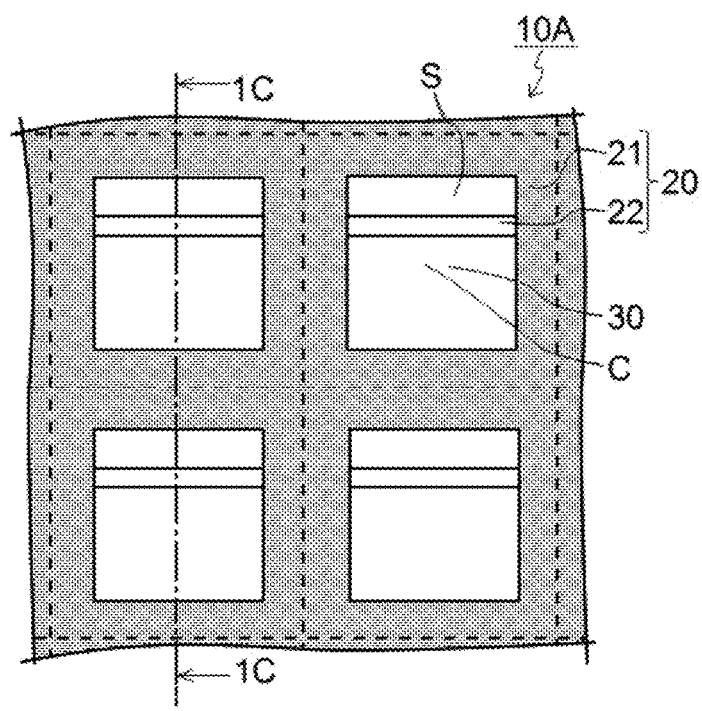
FIG. 1B is a schematic partial top view showing the package of the embodiment.
Figure 1C:
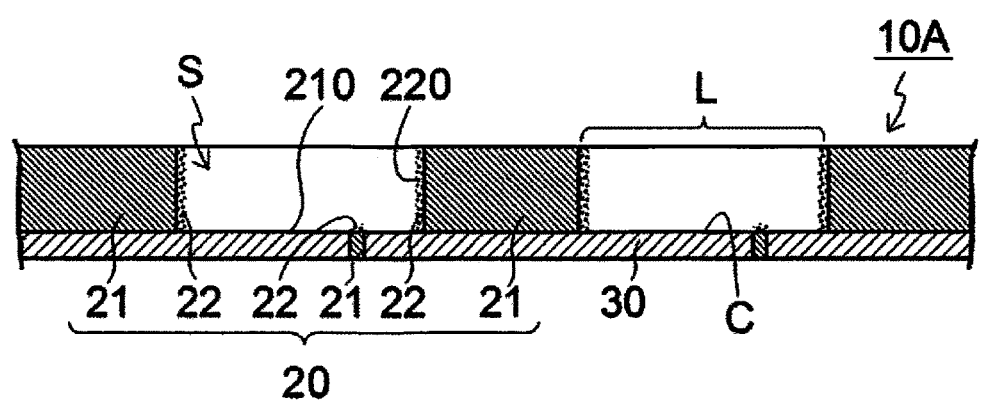
FIG. 1C is a schematic cross section view of line 1C-1C shown in FIG. 1B.

FIG. 1A is a schematic perspective view of an assembly 10A of a package 10 of embodiment 1. FIG. 1B is a schematic top view with a portion of the assembly 10A of the package 10 enlarged. FIG. 1C is a schematic cross section view of line 1C-1C in FIG. 1B.

Each package 10 is provided with recesses S. The package can also be a package of a shape for which recesses are not provided, for example it can be a flat plate shaped package. A top surface (bottom surface of the recess) 210 inside the recess S is provided with a pair of leads 30, and a resin molded body 20 between these. The side wall of the recess S is configured from the resin molded body 20, and an inside surface 220 of the side wall is also configured from the resin molded body 20. As shown in FIG. 1A, the package 10 can be the assembly 10A formed as an integrated unit with the resin molded body 20, or can be a package with formation as respectively separate items.

The top surface inside the recess S includes an element placement region C. The element placement region C indicates a region in which the light emitting element is placed in the light emitting device. In the package 10 before placement of the light emitting element, the regions in which a light emitting element is to be placed are used as the element placement regions.

With the package 10 provided with this kind of recess S, the light from the light emitting elements placed inside the recess S is irradiated on the bottom surface 210 and on the inside surface 220 which are surfaces inside the recess S. In other words, as shown in FIG. 1C, the light irradiation region L indicates the bottom surface 210 and the inside surface 220 of the recess S. In the package before placement of the light emitting elements, the light irradiation region L is the region in which light is to be irradiated.

The resin molded body 20 includes a black resin part 21, and a light reflective foam part 22 arranged on at least a portion of the surface of the black resin part 21. This light reflective foam part 22 is arranged in the light irradiation region L. With embodiment 1, as shown in FIG. 1C, light reflective foam parts 22 are arranged on the surface of the resin molded body 20 on the bottom surface 210 of the recess S, and on the surface of the resin molded body 20 on the inside surface 220 of the recess S.

The light reflective foam part 22 is a portion of the resin molded body 20, and is a part for which the surface of the black resin part 21 has been foamed. In other words, the light reflective foam part 22 and the black resin part 21 are an integrated unit. The light reflective foam part 22 is made to protrude from the surface of the black resin part 21.

Because the black resin part 21 is black, the reflection rate of light from the light emitting elements is low. By foaming, the light reflective foam part 22 has a higher light reflection rate than the non-foamed part of the black resin part 21. For example, the reflection rate of the light reflective foam part 22 in relation to the light from the light emitting elements can be 40% or greater, 60% or greater, 80% or greater, etc.

By arranging this kind of light reflective foam part 22 with a high light reflection rate in the light irradiation region L, it is possible to reduce the absorption of light from the light emitting elements. The top surface of the side wall of the recess S does not have the light reflective foam part, and the black resin part 21 is exposed at the surface. Because of that, when using a light emitting device using this kind of package 10 for a display or the like, it is possible to improve the contrast.

The light reflective foam part 22 is preferably arranged on 30% or more, and more preferably 50% or more of the surface area of the resin molded body 20 positioned in the light irradiation region L. Also, the light reflective foam part 22 can be approximately several μm to several tens of μm thick, for example. The surface of the light reflective foam part 22 is a surface with irregularities.

As the resin material used for the resin molded body 20 of the package 10, for example, it is possible to configure this using a resin such as a thermosetting resin, a thermoplastic resin or the like. In specific terms, examples of a thermosetting resin include resins such as an epoxy resin composition, a modified epoxy resin composition, a silicone resin composition, a modified silicone resin composition, a silicone modified epoxy resin, an epoxy modified silicone resin composition, a polyimide resin composition, a modified polyimide resin composition, unsaturated polyester or the like, and examples of a thermoplastic resin include a polyamide, a polyphthalamide (PPA), a polycarbonate resin, a polyphenylene sulfide (PPS), a liquid crystal polymer (LCP), an ABS resin, a phenol resin, an acrylic resin, a PBT resin or the like, and it is possible to use a resin including at least one item from among these. With thermosetting resin and thermoplastic resin, the light reflective foam part forming conditions, etc., are different, and for this specification, the conditions for thermoplastic resin will be primarily explained.

Also, a black material such as carbon black, etc. is contained in the resin material. For example, when using carbon black, it is preferably contained at 10 wt %-60 wt %, and more preferably 15 wt %-50 wt % in relation to the total weight of the resin material. It is also possible to provide additives, etc. for reinforcing the mechanical strength, etc. For example, it is possible to contain a light reflecting material such as titanium oxide, silicon oxide, zirconium oxide, potassium titanate, alumina, aluminum nitride, zinc oxide, boron nitride, mullite, or the like.

After division, the lead 30 of the package 10 is exposed to the resin molded body 20 on the side surface of the package 10 or the bottom surface of the package 10, or on both the side surface and the bottom surface. It is thereby possible to feed power from an external power supply. The side surface of the lead 30 can be flush with the side surface of the resin part, or can protrude. Also, a portion of the lead 30 can be provided with a part that is more recessed than the side surface of the resin part.

With the divided package 10, the lead 30 can be exposed to one, or a plurality of two or more, of the plurality of side surfaces. For example, in the case of the package 10 that is square in the top view, it is possible to have the lead 30 be exposed at two facing side surfaces.

Embodiment 2

Figure 2A:
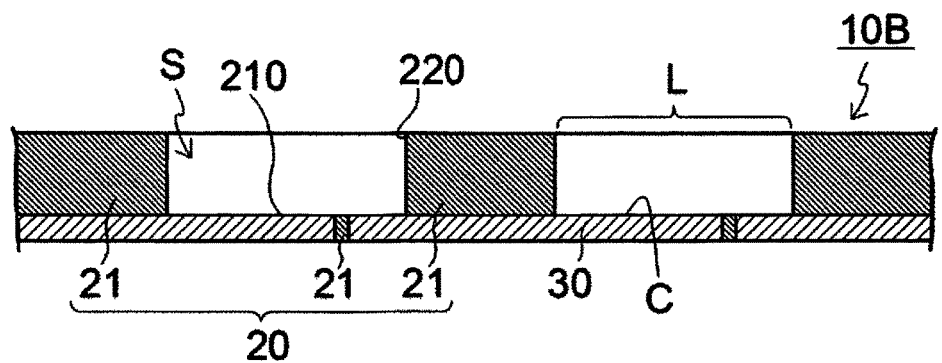
FIG. 2A is a schematic cross section view showing a method for manufacturing a package of the embodiment.
Figure 2B:
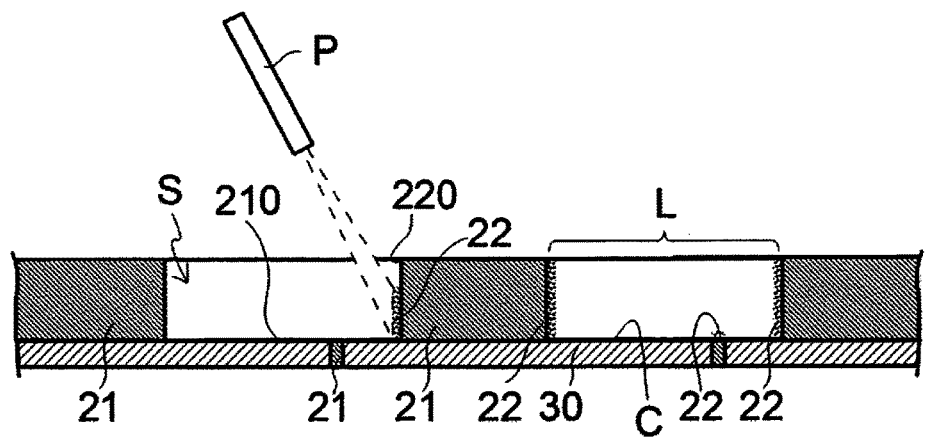
FIG. 2B is a schematic cross section view showing the method for manufacturing the package of the embodiment.

FIG. 2A and FIG. 2B are schematic drawings for explaining the method for manufacturing the package of embodiment 2. First, a package intermediate body 10B is prepared. In FIG. 2A, an example of the assembly of the package intermediate body 10B is shown. With the package intermediate body 10B, the resin molded body 20 is provided with the recess S. The top surface 210 inside the recess S is provided with a pair of leads 30, and the resin molded body 20 between these. The resin molded body 20 consists of only the black resin part 21.

Next, as shown in FIG. 2B, laser light is irradiated on the bottom surface 210 and the inside surface 220 of the recess S which are the light irradiation region L. As the laser light source P that emits laser light, examples include semiconductor lasers such as a gallium nitride based semiconductor laser, etc., a solid-state laser such as YAG, ruby, $YVO_4$ or the like, a gas laser such as a $CO_2$, He—Ne, or excimer laser, etc. Also, the wavelength of the laser light can be 200 nm-10600 nm, for example.

Gas is generated from the black resin part 21 irradiated by laser light due to heat. The generated gas is enclosed inside the black resin part 21. A portion of the black resin part 21 thereby becomes the light reflective foam part 22 which was foamed. In other words, the light reflective foam part 22 is formed by a portion of the black resin part 21 being degenerated, and there are parts for which the boundary is not clear. When a great deal of heat is generated due to continuing irradiation of laser light, the resin material is carbonized and becomes black. Because of that, it is necessary to irradiate laser light under conditions for which carbonization will not occur. The laser light irradiation conditions can be adjusted using the composition of the resin material that configures the resin molded body, the intensity of the laser light, the wavelength of the laser light, etc. For example, when using silicone resin as the black resin part 21, and using $YVO_4$ or YAG as the laser light source and irradiating laser light of wavelength 1064 nm, the light reflective foam part can be formed by setting the irradiation time per unit surface area to approximately $1/1000$ second to $1/100000$ second, for example.

In this way, by irradiating laser light on the resin molded body 20, it is possible to use the black resin part 21 for which light is easily absorbed as the light reflective foam part 22. In other words, it is possible to form the light reflective foam part 22 for which light absorption is reduced using a relatively simple method of irradiating laser light on the resin molded body 20 obtained with one molding, so it is possible to obtain a package with costs kept down more than with methods that form the package using two-color molding.

Also, the light reflective foam part 22 can also be irradiated in a region other than the light irradiation region L. For example, it is also possible to form a light reflecting region of a shape such as a letter or symbol, etc. on the bottom surface or outside surface, etc., of the package 10, and to use these as cathode marks or lot marks, etc.

Working as described above, it is possible to obtain the kind of assembly 10A of the package 10 shown in FIG. 1A to FIG. 1C.

Embodiment 3

Figure 3:
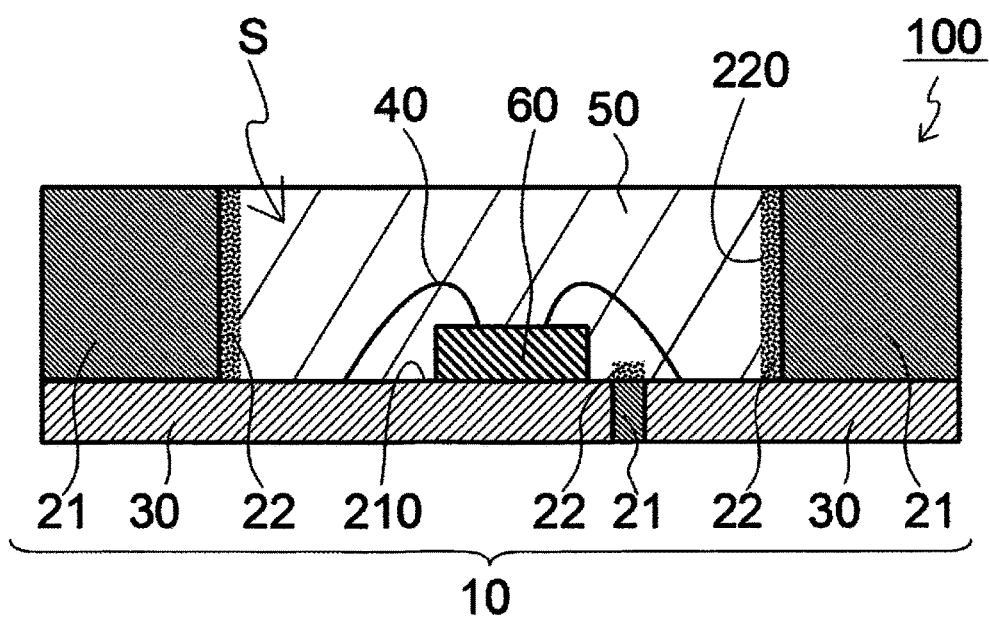
FIG. 3 is a schematic cross section view showing a light emitting device of another embodiment.

FIG. 3 is a schematic cross section view of a light emitting device 100 of embodiment 3. The light emitting device 100 uses the package 10 of embodiment 1. The light emitting device 100 is provided with the package 10, and a light emitting element 60 placed in the package 10. The package 10 is provided with the pair of leads 30, and the resin molded body 20 for holding the pair of leads 30. The light emitting element 60 is placed in the element placement region on the top surface of the package 10. In FIG. 3, the package 10 is provided with the recess S, and the bottom surface 210 of the recess S is the top surface of the package 10. The light emitting element 60 is electrically connected to the leads 30 of the package 10 with wires 40 interposed. A sealing member 50 that covers the light emitting element 60 is arranged inside the recess S.

Flip-chip mounting can also be used for the light emitting element 60. In that case, rather than using wires, the electrodes of the light emitting element 60 and the leads 30 are electrically connected using an electrically conductive joining member. Also, when doing flip-chip mounting for the light emitting element 60, the resin molded body 20 between the pair of leads 30 has the height of the light reflective foam part 22 of the surface at a height that is the same or lower than the height of the bottom surface of the light emitting element.

The resin molded body 20 is provided with the black resin part 21, and the light reflective foam part 22 which is arranged on at least a portion of the surface of the black resin part 21. The light reflective foam part 22 is arranged in the light irradiation region in which light from the light emitting element 60 is irradiated.

The light reflecting region is the bottom surface 210 and the inside surface 220 which are surfaces inside the recess S. The light reflective foam part 22 is provided on the resin molded body 20 of the inside surface 220 of the recess S and the top surface of the resin molded body 20 of the bottom surface 210 of the recess S.

An item of any wavelength can be selected for the light emitting element 60. For example, when using the light emitting device for a display device used as a full color display, three colors of light emitting element are used, blue, green, and red. As the blue and green light emitting elements, it is possible to use items that use ZnSe or nitride-based semiconductors ($In_XAl_YGa_{1-X-Y}N$, $0 \leq X$, $0 \leq Y$, $X+Y \leq 1$). Also, as the red light emitting element, it is possible to use GaAs, InP or the like. Furthermore, it is possible to use a semiconductor light emitting element comprising materials other than these. Selection of items such as the composition, light emission color, size, quantity, etc. of the used light emitting element can be made as appropriate according to the purpose.

It is also possible to use a light emitting element that outputs not only light in the visible light range, but also ultraviolet rays or infrared rays. Furthermore, together with the light emitting elements, it is possible to also mount light receiving elements, and protective elements for protecting those semiconductor elements from damage due to excess voltage (e.g. Zener diodes or capacitors), or a combination of those.

A pair of electrodes of the light emitting element 60 are electrically connected to the leads 30 with the joining member interposed, or with the wires 40 interposed. As the joining member, for example, it is possible to use an insulating joining member or an electrically conductive joining member. Resin is an example of the insulating joining member, and examples of that include transparent resin or white resin, etc. As the electrically conductive joining member, examples include a eutectic material or solder. As a preferable eutectic material, examples include an alloy with Au and Sn as main components, an alloy with Au and Si as main components, an alloy with Au and Ge as main components, etc. As the solder, examples include an alloy with Ag, Cu, and Sn as main components, an alloy with Cu and Sn as main components, an alloy with Bi and Sn as main components, etc.

The sealing member 50 is a member for protecting electronic components mounted on the package 10, such as the light emitting elements 60, protective elements, the wires 40, etc., from dust, moisture, external forces, and the like. As the material of the sealing member 50, it is preferable to use a translucent item that allows light from the light emitting elements 60 to be transmitted, and that has light resistance so as not to be susceptible to degradation due to those. Examples of a specific material for the sealing member 50 include insulating resin compositions having translucency that allow light from the light emitting elements to be transmitted, such as a silicone resin composition, an epoxy resin composition, etc. Also, the sealing member 50 is not limited to these organic substances, and it is also possible to use inorganic substances such as glass, silica sol, etc. In addition to this kind of material, it is also possible to contain a coloring agent, a diffusing agent, a light reflecting material, various types of fillers, a wavelength conversion member (phosphor), etc., as desired. The filling amount of the sealing member is sufficient provided it is an amount that covers the abovementioned electronic components. As described above, the light reflective foam part 22 has an irregular surface. Because of that, the contact surface area with the sealing member 50 is broader than when the light reflective foam part 22 is not provided. It is thereby possible to improve the adhesion between the sealing member 50 and the package 10.

As the phosphor contained in the sealing member 50, examples include green to yellow light emitting YAG-based, LAG-based, green light emitting SiAlON-based (β sialon), red light emitting SCASN, CASN-based, and KSF-based phosphors ($K_2SiF_6$: Mn), and sulfide-based phosphors, etc., either alone or in combination.

Embodiment 4

Figure 4A:
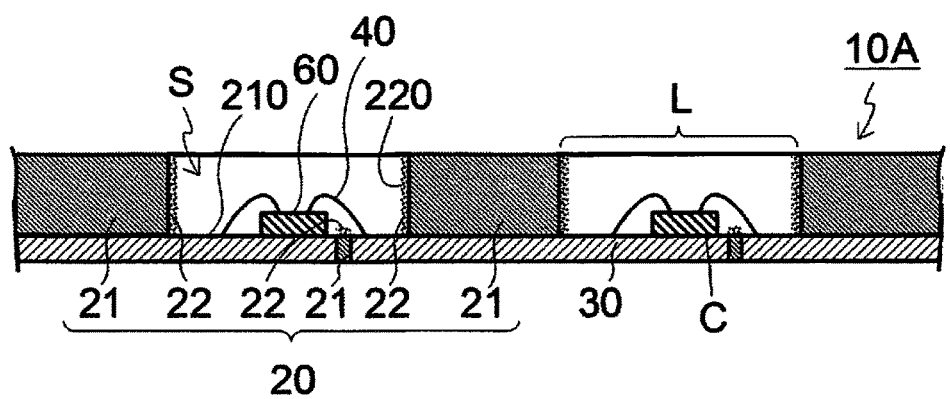
FIG. 4A is a schematic cross section view showing the method for manufacturing the light emitting device of the embodiment.
Figure 4B:
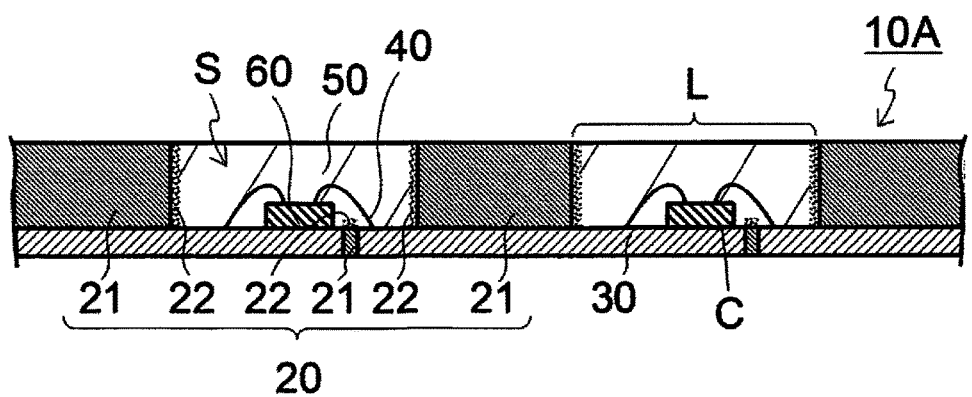
FIG. 4B is a schematic cross section view showing the method for manufacturing the light emitting device of the embodiment.

FIG. 1C, FIG. 4A, and FIG. 4B are schematic diagrams for explaining the method for manufacturing the light emitting device 100 of embodiment 4. First, provided is a step of preparing the package 10 of embodiment 1 or its assembly 10A. More specifically, this is a step of preparing the assembly 10A of the package 10 for which provided are the pair of leads 30, and the resin molded body 20 for holding the pair of leads 30, provided are the element placement region C arranged on the top surface 210, and the light irradiation region L in which light from the light emitting elements placed in the element placement region C is irradiated, and provided is the light reflective foam part 22 arranged on the light irradiation region L. It is also possible to do preparation by purchasing this kind of package 10 or its assembly 10A, etc., or alternatively, it is possible to do preparation by forming using the method for manufacturing the package 10 of embodiment 2.

Next, the light emitting elements 60 are placed as shown in FIG. 4A. The light emitting elements 60 are joined on the element placement region C with a joining member or the like interposed. Also, the leads 30 of the package 10 and the electrodes of the light emitting elements 60 are connected using the wires 40.

Next, as shown in FIG. 4B, the sealing member 50 is formed by potting or the like inside the recesses S. Finally, the resin molded body 20 of the assembly 10A of the package 10 is cut between the recess S and the adjacent recess S, to obtain the kind of divided light emitting device 100 shown in FIG. 3.

The package and the light emitting device of the present disclosure can be used as a display light source or the like.

What is claimed is:

1. A package comprising:
   an element placement region;
   a pair of leads; and
   a resin molded body holding the pair of leads, the resin molded body including
      a black resin part, and
      a light reflective foam part arranged at least on a part of a surface of the black resin part in a light irradiation region configured to be irradiated by light from a light emitting element placed in the element placement region.

2. The package according to claim 1, wherein
   the black resin part defines a part of a recess, and
   the light reflective foam part is arranged on at least one of a side surface and a bottom surface of the recess.

3. A light emitting device comprising:
   the package according to claim 1; and
   a light emitting element placed in the element placement region.

4. A method for manufacturing a package comprising:
   providing a lead frame including packages, each of the packages including
      an element placement region,
      a pair of leads constituted by the lead frame, and
      a resin molded body holding the pair of leads, the resin molded body including a black resin part; and
   forming a light reflective foam part by foaming a portion of the black resin part arranged in a light irradiation region configured to be irradiated by a light emitting element placed on the element placement region.

5. The method for manufacturing a package according to claim 4, wherein
   the forming of the light reflective foam part includes irradiating laser light to the portion of the black resin part.

6. A method for manufacturing a light emitting device comprising:
   providing a package including a pair of leads and a resin molded body holding the pair of leads, the package including an element placement region and a light irradiation region configured to be irradiated by light from a light emitting element placed in the element placement region, a light reflective foam part being arranged in the light irradiation region; and
   placing the light emitting element in the element placement region.

* * * * *